United States Patent
Schafer (10) Patent No.: US 10,276,555 B2
(45) Date of Patent: Apr. 30, 2019

(54) METHOD AND SYSTEM FOR PROVIDING A MAGNETIC CELL USABLE IN SPIN TRANSFER TORQUE APPLICATIONS AND INCLUDING A SWITCHABLE SHUNTING LAYER

(71) Applicant: Samsung Electronics Co., LTD., Gyeonggi-do (KR)

(72) Inventor: Sebastian Schafer, San Jose, CA (US)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/354,934

(22) Filed: Nov. 17, 2016

(65) Prior Publication Data

US 2018/0096982 A1    Apr. 5, 2018

Related U.S. Application Data (60) Provisional application No. 62/403,135, filed on Oct. 1, 2016.

(51) Int. Cl.
    *H01L 43/02*      (2006.01)
    *H01L 29/82*      (2006.01)
    (Continued)

(52) U.S. Cl.
CPC ........ *H01L 27/0248* (2013.01); *G11C 11/161* (2013.01); *G11C 11/1659* (2013.01); *G11C 11/1675* (2013.01); *H01L 27/224* (2013.01); *H01L 43/02* (2013.01); *H01L 43/08* (2013.01); *H01L 43/12* (2013.01); *H01L 45/06* (2013.01); *H01L 45/065* (2013.01); *H01L 45/144* (2013.01)

(58) Field of Classification Search
CPC .. H01L 27/2427; H01L 27/222–27/228; H01L 43/08–43/10
See application file for complete search history.

(56) References Cited

U.S. PATENT DOCUMENTS 5,699,212 A    12/1997   Erpelding
7,236,334 B2    6/2007    Ding
(Continued)

OTHER PUBLICATIONS

"Nanosecond threshold switching of GeTe6 cells and their potential as selector devices," M. Anbarasu, Martin Wimmer, Gunnar Bruns, Martin Salinga, and Matthias Wuttig, Applied Physics Letters, 100, 143505 (2012); doi: 10.1063/1.3700743, 4pp.

(Continued)

*Primary Examiner* — Maliheh Malek
(74) *Attorney, Agent, or Firm* — Van Pelt, Yi & James LLP (57) ABSTRACT

A magnetic cell and method for providing the magnetic cell are described. A magnetic cell resides on a substrate and is usable in a magnetic device. The magnetic cell includes a magnetic junction and an ovonic threshold switch (OTS) layer. The magnetic junction has a plurality of sidewalls. The magnetic junction includes a free layer switchable between a plurality of stable magnetic states when a write current is passed through the magnetic junction, a nonmagnetic spacer layer and a pinned layer. The nonmagnetic spacer layer is between the pinned layer and the free layer. The OTS layer covers at least a portion of the plurality of sidewalls.

18 Claims, 5 Drawing Sheets

(51) Int. Cl.
*H01L 43/12* (2006.01)
*G11C 11/16* (2006.01)
*H01L 27/02* (2006.01)
*H01L 27/22* (2006.01)
*H01L 43/08* (2006.01)
*H01L 45/00* (2006.01)

(56) References Cited

U.S. PATENT DOCUMENTS

| | | | |
|---|---|---|---|
| 7,326,979 B2 | 2/2008 | Rinerson | |
| 7,868,620 B2 | 1/2011 | Moe | |
| 8,377,741 B2* | 2/2013 | Savransky | H01L 27/2427 257/2 |
| 8,467,235 B2* | 6/2013 | Slonczewski | B82Y 25/00 365/158 |
| 8,885,395 B2* | 11/2014 | Zhou | G11C 11/161 365/148 |
| 8,934,293 B1* | 1/2015 | Shepard | G11C 8/14 365/163 |
| 9,099,538 B2* | 8/2015 | Shih | H01L 21/76883 |
| 9,123,778 B2* | 9/2015 | Lai | H01L 27/11568 |
| 9,489,998 B1* | 11/2016 | Schafer | G11C 11/161 |
| 9,613,689 B1* | 4/2017 | Takaki | G11C 13/0026 |
| 9,698,346 B2* | 7/2017 | Boniardi | H01L 45/1293 |
| 9,741,764 B1* | 8/2017 | Terai | H01L 27/2427 |
| 9,876,054 B1* | 1/2018 | Apodaca | H01L 45/085 |
| 2006/0054991 A1* | 3/2006 | Kuo | H01L 27/2427 257/528 |
| 2009/0029031 A1* | 1/2009 | Lowrey | H01L 45/06 427/58 |
| 2009/0029534 A1* | 1/2009 | Czubatyj | H01L 45/06 438/492 |
| 2009/0251950 A1* | 10/2009 | Klostermann | G11C 11/16 365/158 |
| 2009/0303784 A1* | 12/2009 | Lowrey | G11C 5/02 365/163 |
| 2010/0163832 A1* | 7/2010 | Kau | H01L 27/2427 257/4 |
| 2010/0270529 A1* | 10/2010 | Lung | G11C 13/0004 257/4 |
| 2011/0155994 A1* | 6/2011 | Mouli | H01L 45/10 257/5 |
| 2011/0215394 A1* | 9/2011 | Komori | H01L 27/11573 257/324 |
| 2012/0119181 A1* | 5/2012 | Oh | H01L 45/04 257/4 |
| 2012/0161096 A1* | 6/2012 | Pellizzer | H01L 27/0207 257/5 |
| 2013/0077381 A1* | 3/2013 | Kwon | G11C 5/02 365/148 |
| 2013/0148418 A1* | 6/2013 | Luo | G11C 11/1675 365/158 |
| 2013/0207068 A1* | 8/2013 | Pellizzer | H01L 45/06 257/5 |
| 2013/0240823 A1* | 9/2013 | Kwon | H01L 27/2409 257/4 |
| 2014/0043911 A1* | 2/2014 | Samachisa | G11C 13/003 365/185.18 |
| 2014/0056060 A1* | 2/2014 | Khvalkovskiy | H01L 27/228 365/158 |
| 2014/0061574 A1* | 3/2014 | Pio | H01L 27/10 257/5 |
| 2014/0070342 A1* | 3/2014 | Sandhu | H01L 43/08 257/421 |
| 2014/0092677 A1* | 4/2014 | Karpov | G11C 11/16 365/158 |
| 2014/0117304 A1* | 5/2014 | Park | H01L 27/226 257/4 |
| 2014/0231940 A1* | 8/2014 | Xia | H01L 43/08 257/421 |
| 2014/0268991 A1* | 9/2014 | Hu | G11C 13/0002 365/148 |
| 2014/0353568 A1* | 12/2014 | Boniardi | H01L 45/1293 257/4 |
| 2015/0243708 A1* | 8/2015 | Ravasio | H01L 27/2463 257/4 |
| 2015/0243883 A1 | 8/2015 | Swaminathan | |
| 2015/0243885 A1* | 8/2015 | Sciarrillo | H01L 45/1233 257/2 |
| 2015/0311252 A1* | 10/2015 | Gan | H01L 43/08 257/421 |
| 2015/0332748 A1* | 11/2015 | Wang | G11C 11/165 365/158 |
| 2015/0372225 A1 | 12/2015 | Gaidis | |
| 2016/0013406 A1* | 1/2016 | Lee | H01L 45/146 257/4 |
| 2016/0056208 A1* | 2/2016 | Pellizzer | H01L 45/06 257/5 |
| 2016/0104544 A1* | 4/2016 | Schafer | G11C 7/04 374/141 |
| 2016/0196859 A1* | 7/2016 | Schafer | G11C 11/161 365/158 |
| 2016/0267379 A1* | 9/2016 | Eleftheriou | G11C 11/5678 |
| 2016/0276022 A1* | 9/2016 | Redaelli | G11C 13/0004 |
| 2016/0308113 A1* | 10/2016 | Kim | H01L 43/02 |
| 2016/0329491 A1* | 11/2016 | Ha | H01L 45/1286 |
| 2017/0031231 A1* | 2/2017 | Bhaskaran | G02F 1/0147 |
| 2017/0053688 A1* | 2/2017 | Seo | G11C 11/1675 |
| 2017/0148851 A1* | 5/2017 | Hsu | H01L 27/11514 |
| 2017/0148852 A1* | 5/2017 | Boniardi | H01L 27/2481 |
| 2017/0170237 A1* | 6/2017 | Jung | H01L 27/2481 |
| 2017/0200768 A1* | 7/2017 | Park | H01L 27/2427 |
| 2017/0207273 A1* | 7/2017 | Sciarrillo | H01L 27/2427 |
| 2017/0222140 A1* | 8/2017 | Masuoka | H01L 43/12 |
| 2017/0236873 A1* | 8/2017 | Chen | G11C 13/0069 438/382 |
| 2017/0243919 A1* | 8/2017 | Seong | H01L 27/249 |
| 2017/0243922 A1* | 8/2017 | Eun | H01L 23/528 |
| 2017/0250222 A1* | 8/2017 | Wu | H01L 45/06 |
| 2017/0263862 A1* | 9/2017 | Bernhardt | H01L 45/06 |
| 2017/0271580 A1* | 9/2017 | Park | H01L 45/06 |
| 2017/0271582 A1* | 9/2017 | Gotti | H01L 45/04 |
| 2017/0271592 A1* | 9/2017 | Lee | H01L 45/1675 |
| 2017/0288138 A1* | 10/2017 | Lee | H01L 27/2409 |
| 2018/0158872 A1* | 6/2018 | Park | H01L 27/2463 |
| 2018/0159030 A1* | 6/2018 | Park | H01L 45/1233 |
| 2018/0204881 A1* | 7/2018 | Sei | H01L 27/105 |
| 2018/0205009 A1* | 7/2018 | Schafer | H01L 43/12 |
| 2018/0211703 A1* | 7/2018 | Choi | G11C 13/0038 |

OTHER PUBLICATIONS

"Picosecond Electric-Field-Induced Threshold Switching in Phase-Change Materials," P.Zalden; M.J. Shu; F.Chen; X. Wu; Y.Zhu; H.Wen; S.Johnston; Z-X Shen; P.Landreman; M.Brongersma; S.W. Fong; H.S.P.Wong; M-J Sher; P.Jost; M.Kaes; M.Salinga; A.von Hoegen; M.Wuttig and A.M.Lindenberg; Physical Review Letters, PRL 117, 067601 (2016), DOI: 10.1103/PhysRevLett.117.067601, 6pp.

* cited by examiner

FIG. 13

METHOD AND SYSTEM FOR PROVIDING A MAGNETIC CELL USABLE IN SPIN TRANSFER TORQUE APPLICATIONS AND INCLUDING A SWITCHABLE SHUNTING LAYER

CROSS-REFERENCE TO RELATED APPLICATIONS

This application claims the benefit of provisional Patent Application Ser. No. 62/403,135, filed Oct. 1, 2016, entitled MTJ OTS ENCAPSULATION, assigned to the assignee of the present application, and incorporated herein by reference.

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-MRAM). STT-MRAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state.

For example, a conventional magnetic tunneling junction (MTJ) may be used in a conventional STT-MRAM. The conventional MTJ typically resides on a substrate. The conventional MTJ, uses conventional seed layer(s), may include capping layers and may include a conventional antiferromagnetic (AFM) layer. The conventional MTJ includes a conventional pinned layer, a conventional free layer and a conventional tunneling barrier layer between the conventional pinned and free layers. A bottom contact below the conventional MTJ and a top contact on the conventional MTJ may be used to drive current through the conventional MTJ in a current-perpendicular-to-plane (CPP) direction.

The conventional pinned layer and the conventional free layer are magnetic. The magnetization of the conventional pinned layer is fixed, or pinned, in a particular direction. The conventional free layer has a changeable magnetization. The conventional free layer may be a single layer or include multiple layers. The pinned layer and free layer may have their magnetizations oriented perpendicular to the plane of the layers (perpendicular-to-plane) or in the plane of the layers (in-plane).

To switch the magnetization of the conventional free layer, a current is driven perpendicular to plane. When a sufficient current is driven from the top contact to the bottom contact, the magnetization of the conventional free layer may switch to be parallel to the magnetization of a conventional bottom pinned layer. When a sufficient current is driven from the bottom contact to the top contact, the magnetization of the free layer may switch to be antiparallel to that of the bottom pinned layer. The differences in magnetic configurations correspond to different magnetoresistances and thus different logical states (e.g. a logical "0" and a logical "1") of the conventional MTJ.

Because of their potential for use in a variety of applications, research in magnetic memories is ongoing. Mechanisms for improving the performance of STT-MRAM are desired. For example, current magnetic junctions may be damaged during use. A transistor coupled with the conventional MTJ may have an overshoot voltage. Exposure to such an overshoot voltage may damage the MTJ. Further, if electrostatic discharge (ESD) protection is not provided on a circuit level, ESD voltage may also damage or destroy the conventional MTJ. Performance, lifetime and reliability of the magnetic junction may be adversely affected. Accordingly, what is needed is a method and system that may improve the performance of the spin transfer torque based memories. The method and system described herein address such a need.

BRIEF SUMMARY OF THE INVENTION

A magnetic cell and method for providing the magnetic cell are described. A magnetic cell resides on a substrate and is usable in a magnetic device. The magnetic cell includes a magnetic junction and an ovonic threshold switch (OTS) layer. The magnetic junction has a plurality of sidewalls. The magnetic junction includes a free layer switchable between a plurality of stable magnetic states when a write current is passed through the magnetic junction, a nonmagnetic spacer layer and a pinned layer. The nonmagnetic spacer layer is between the pinned layer and the free layer. The OTS layer covers at least a portion of the plurality of sidewalls.

Use of the OTS layer may allow excess current to be shunted away from the magnetic junction when a sufficiently high voltage is applied across the magnetic junction. Consequently, the magnetic junction may be less likely to be damaged and the pulse applied to the magnetic cell may be shaped.

DETAILED DESCRIPTION OF THE INVENTION

The exemplary embodiments relate to magnetic junctions usable in magnetic devices, such as magnetic memories, and the devices using such magnetic junctions. The magnetic memories may include spin transfer torque magnetic random access memories (STT-MRAMs) and may be used in electronic devices employing nonvolatile memory. Such electronic devices include but are not limited to cellular phones, smart phones, tables, laptops and other portable and nonportable computing devices. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

A magnetic cell and method for providing the magnetic cell are described. The magnetic cell resides on a substrate and is usable in a magnetic device. The magnetic cell includes a magnetic junction and an ovonic threshold switch (OTS) layer. The magnetic junction has a plurality of sidewalls. The magnetic junction includes a free layer switchable between a plurality of stable magnetic states when a write current is passed through the magnetic junction, a nonmagnetic spacer layer and a pinned layer. The nonmagnetic spacer layer is between the pinned layer and the free layer. The OTS layer covers at least a portion of the plurality of sidewalls.

The exemplary embodiments are described in the context of particular methods, magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin transfer phenomenon, of magnetic anisotropy, and other physical phenomenon. Consequently, one of ordinary skill in the art will readily recognize that theoretical explanations of the behavior of the method and system are made based upon this current understanding of spin transfer, magnetic anisotropy and other physical phenomena. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions and/or substructures having particular layers. However, one of ordinary skill in the art will readily recognize that magnetic junctions and/or substructures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. As used herein, "in-plane" is substantially within or parallel to the plane of one or more of the layers of a magnetic junction. Conversely, "perpendicular" and "perpendicular-to-plane" corresponds to a direction that is substantially perpendicular to one or more of the layers of the magnetic junction.

Figure 1A:
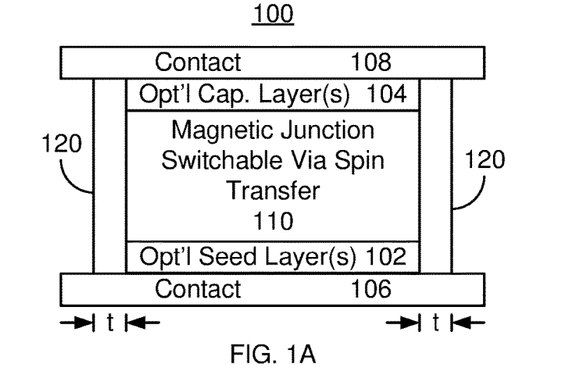
FIGS. 1A and 1B are side and plan views of an exemplary embodiment of a magnetic cell usable in a magnetic devices such as a magnetic memory programmable using spin transfer torque.
Figure 1B:
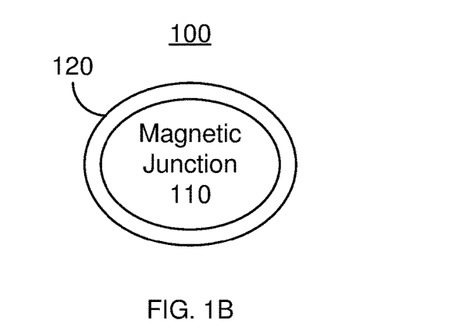

FIGS. 1A and 1B are side and plan views of an exemplary embodiment of a magnetic cell 100 usable in a magnetic devices such as a magnetic memory programmable using spin transfer torque. For clarity, FIGS. 1A-1B are not to scale. Further, other components that might be considered part of the cell 100, such as a selection transistor, are not shown for simplicity. The magnetic cell 100 may be used in a magnetic device such as a spin transfer torque magnetic random access memory (STT-MRAM) and, therefore, in a variety of electronic devices. The magnetic cell 100 includes a magnetic junction 110 that is switchable using spin transfer torque and ovonic threshold switching (OTS) layer 120. The OTS layer 120 switches from a high resistivity (insulating) state to a low resistivity (conducting) state when under the influence of a voltage greater than a threshold voltage. For example, the resistivity of the OTS layer 120 may be in excess of 5000 kΩ/nm when in the insulating state and not more than 100 kΩ/nm when in the conductive state. In some embodiments, the resistivity of the OTS layer may be not more than 10 Ωk/nm in the conductive state. Although termed an OTS layer 120, in other embodiments, other materials and/or structures which switch from nonconductive to conductive based on a threshold voltage may be used. Also shown are optional seed layer(s) 102, optional capping layer(s) 104 and contacts 106 and 108. Thus, in the embodiment shown, current is driven in the current perpendicular to plane (CPP) direction. However, other directions of current are possible.

Figure 2:
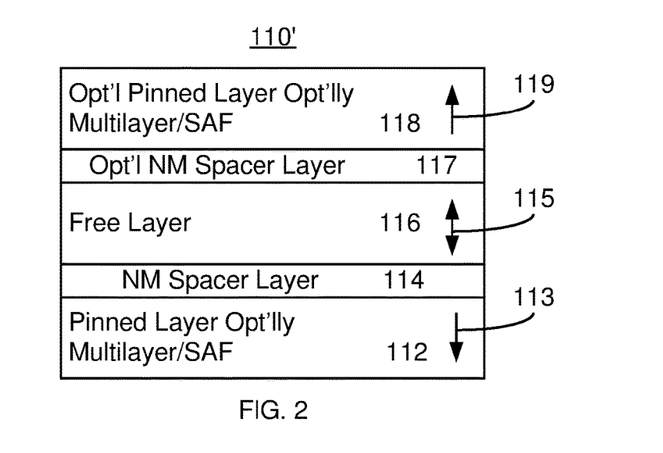
FIG. 2 depicts an exemplary embodiment of a magnetic junction usable in a magnetic cell.

The magnetic junction 110 is programmable using spin transfer. For example, FIG. 2 depicts an exemplary embodiment of a magnetic junction 110' that may be used as the magnetic junction 110. The magnetic junction 110' may include a pinned layer 112 having a magnetic moment 113, a nonmagnetic spacer layer 114, a free layer 116 having magnetic moment 115, an optional additional nonmagnetic spacer layer 117 and an optional additional pinned layer 118 having magnetic moment 119. One or more of the layers 112, 114, 116, 117 and 118 may be multilayers. In other embodiments, other layers, such as polarization enhancement layer(s) and other structures might also be included within the magnetic junction 110.

The magnetic junction 110' shown is a dual magnetic junction. In another embodiment, the nonmagnetic spacer layer 117 and pinned layer 118 might be omitted. In such an embodiment, the magnetic junction 110' is a bottom pinned magnetic junction. Alternatively, the nonmagnetic spacer layer 114 and the pinned layer 112 may be omitted. In such an embodiment, the magnetic junction 110' is a top pinned magnetic junction. Optional pinning layer(s) (not shown) may be used to fix the magnetization of the pinned layer(s) 112 and/or 118. In some embodiments, the optional pinning layer may be an AFM layer or multilayer that pins the magnetization(s) through an exchange-bias interaction. However, in other embodiments, the optional pinning layer may be omitted or another structure may be used. In the embodiment shown, the magnetic moments 113 and 119 of the pinned layers 112 and 118, respectively, are pinned by the magnetic anisotropy of the layers 112 and 118, respectively. The free layer 116 and the pinned layers 112 and 118 have a high perpendicular magnetic anisotropy (PMA). Stated differently, the perpendicular magnetic anisotropy energy exceeds the out-of-plane demagnetization energy for the layers 112, 106 and 118. Such a configuration allows for the magnetic moments 113, 115 and 119 of the layers 112, 116 and 122, respectively, having a high PMA to be stable perpendicular to plane. However other orientations are possible. The nonmagnetic spacer layer(s) 114 and 117 may be tunneling barrier layers. For example, the nonmagnetic spacer layer 106 and/or 110 may be a crystalline MgO tunneling barrier with a (100) orientation. Such nonmagnetic spacer layers 114 and 117 may enhance TMR of the magnetic junction 110'.

The magnetic junction 110' is also configured to allow the free layer magnetic moment 115 to be switched between stable magnetic states when a write current is passed through the magnetic junction 110'. Switching of the magnetic moment 115 of the free layer 116, for example from parallel to the magnetic moment 113 to antiparallel or vice versa, is accomplished in whole or in part using spin transfer. Thus, the free layer 116 is switchable utilizing spin transfer torque when a write current is driven through the magnetic junction 110' in a CPP direction. The direction of the magnetic moment 115 of the free layer 116 may be read by driving a read current through the magnetic junction 110'.

Referring to FIGS. 1A-2, the magnetic cell 100 also includes OTS layer 120 that is on the sidewalls of the magnetic junction 110. In some embodiments, the OTS layer 120 and sidewalls of the magnetic junction 110/110' share an interface. Alternatively, one or more other layers may be between the magnetic junction 110/110' and the OTS layer 120. In the embodiment shown, the sidewalls of the magnetic junction 110/110' are completely covered by the OTS layer 120. In other embodiments, the sidewalls may be only partially covered. For example, the OTS layer 120 may not extend to the top of the magnetic junction 110/110'. The OTS layer 120 is desired, however, to extend across the nonmagnetic spacer layer(s) 114 and/or 117. The OTS layer 120 is also generally desired to be continuous. The thickness, t, of the OTS layer 120 may depend upon its function. In some embodiments, the OTS layer 120 is continuous and not more than two nanometers thick for a magnetic junction 110 having a diameter on the order of twenty through thirty nanometers. Such a thickness may shunt a smaller amount of current. The OTS layer 120 in this thickness range may have particular utility in pulse shaping during programming, as described below. In other embodiments, the OTS layer 120 is not more than ten nanometers thick for a magnetic junction 110 having a diameter on the order of twenty through thirty nanometers. Such a thickness may have particular utility in providing a higher shunt current. This may be used in providing protection against damage due to electrostatic discharge (ESD). In some such embodiments, the OTS layer 120 is at least two nanometers thick.

The OTS layer 120 is insulating unless the voltage across the OTS layer 120 (between the contacts 106 and 108) meets or exceeds the threshold voltage. If the voltage applied across the OTS layer 120 is greater than or equal to the threshold voltage of the OTS layer 120, then the OTS layer is conductive and has a resistivity of not more than 100 kΩ/nm. Thus, current is shunted away from the magnetic junction 110/110' and through the OTS layer 120. If the voltage applied is not greater than the threshold voltage of the OTS layer 120, then the OTS layer 120 is insulating and has a resistivity in excess of 5000 kΩ/nm. The OTS layer 120 may include one or more of GeSbTe (GST), $GeTe_6$ and AnInSbTe. Such materials may be configured such that the threshold voltage causing a change in the resistivity is at least 0.5 volts and not more than five volts. In some such embodiments, the threshold voltage is not more than two volts. In some embodiments, the threshold voltage is at least one volt. Other threshold voltages may be used. The threshold voltage may be set lower than the voltage that would cause damage to or destruction of portions of the magnetic junction 110/110'. For example, the threshold voltage of the OTS layer 120 may be set below the voltage at which a tunneling barrier layer 114 and/or 117 would be damaged or be subject to breakdown.

Figure 3A:
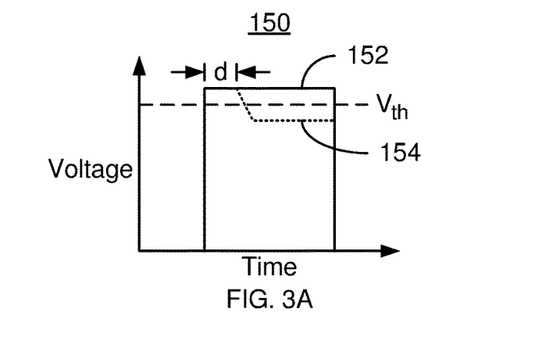
FIGS. 3A-3B are graphs depicting exemplary embodiments of voltage and current through portions of a magnetic cell usable in a magnetic devices.
Figure 3B:
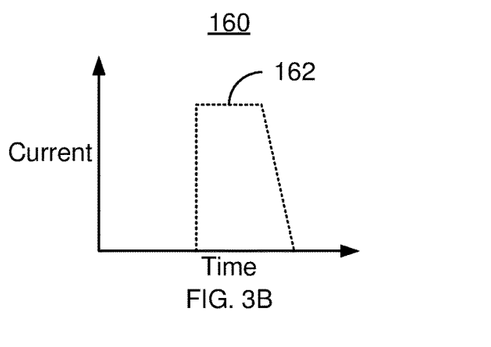

FIGS. 3A and 3B are graphs 150 and 160, respectively, depicting exemplary embodiments of voltage and current through portions of the magnetic cell 100 during programming. FIG. 3A depicts an applied voltage pulse 152 that has a magnitude higher than the threshold voltage of the OTS layer 120. In some embodiments, the applied voltage pulse 152 is desired to have a magnitude of at least 1.1 multiplied by the threshold voltage and not more than twice the threshold voltage. Other values of the applied voltage are possible. Further, although a square wave is applied, the pulse 156 may have another shape.

The curve 154 in FIG. 3A indicates the voltage across the nonmagnetic spacer layer(s) 114 and/or 117. As can be seen by the curve 154, there is a slight delay time, d, between application of the voltage and shunting of the current by the OTS layer 120. This delay is desired to be not more than 5 nanoseconds. In some embodiments, the delay is at least 0.5 nanoseconds. This delay time may be controlled by the OTS material properties and the magnitude of the pulse applied. For example, the OTS material(s) and stoichiometry may be used to help determine the delay, d. Because the OTS layer 120 becomes conductive when a voltage greater than or equal to $V_{th}$ is applied, some current is shunted away from the magnetic junction 110. Thus, the effective voltage across the magnetic junction 110 is reduced. This can be seen by the drop in curve 154 below the threshold voltage. Simultaneously, the shunt current through the OTS layer 148 increases. This can be seen in curve 162 of FIG. 3B. When the applied voltage across the OTS layer 120 drops below the threshold voltage, then the OTS layer 148 transitions back to its high resistivity state. This transition may occur very rapidly, for example within the nanosecond or microsecond time frame.

In operation, the OTS layer 120 remains insulating and operation of the magnetic cell 100 may be substantially unchanged. For example, the read voltage/current applied to the magnetic cell 100 may be less than the threshold voltage. Thus, the magnetic junction 110 may be read in a conventional manner. During writing, a write voltage larger than the threshold voltage of the OTS layer 120 may be applied to the magnetic cell 100. Because the OTS layer 120 shunts current away from the magnetic junction 110/110' when exposed to a voltage greater than the threshold and because the OTS layer 120 has a short delay, the voltage across the magnetic junction 110 may be tailored. For example, the voltage across the magnetic junction may be shaped in a manner analogous to the curve 154. Thus, the voltage pulse to which the magnetic junction 110 is exposed is initially higher in magnitude, but rapidly drops off to a lower but nonzero level. The high initial voltage may allow for faster initialization of spin transfer torque switching of the free layer 116. The subsequent lower, nonzero voltage may be high enough to finalize the switching of the free layer 116 but low enough that the pinned layer 112 and/or 118 does not undergo back hopping. This may occur for an applied voltage that is at least 1.1 multiplied by the threshold voltage and not more than 2 multiplied by the threshold voltage. Thus, faster and more reliable switching may be achieved.

The OTS layer 120 may also function to protect the magnetic junction 110/110' in other instances. If the OTS layer 120 is sufficiently thick, the OTS layer 120 may protect the magnetic junction 110/110' from ESD damage during fabrication and/or use. In such a case, a portion of a large current due to ESD may be shunted through the OTS layer 120 instead of traveling only through the magnetic junction 110/110'. For similar reasons, the OTS layer 120 may protect the magnetic junction 110/110' from damage in which the magnetic junction 110/110' would otherwise be subjected to an over-voltage large enough to damage the magnetic junction 110/110'. For example, breakdown of a tunneling barrier layer 114 and/or 117 due to ESD or large applied voltages may be avoided. Thus, damage to the magnetic junction 110/110' may be reduced or eliminated.

The magnetic cell 100 may have improved performance. Using the OTS layer 120, shaping of a write pulse may be carried out without requiring external control. This high initial voltage, lower subsequent voltage shaped pulse may allow for faster and more reliable switching. In addition, ESD damage may be reduced or eliminated. Thus, reliability of the magnetic cell 100 may be improved.

Figure 4A:
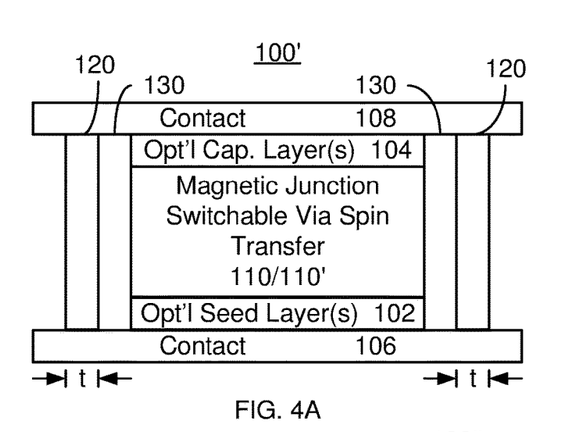
FIGS. 4A and 4B are side and plan views of another exemplary embodiment of a magnetic cell usable in a magnetic devices such as a magnetic memory programmable using spin transfer torque.
Figure 4B:
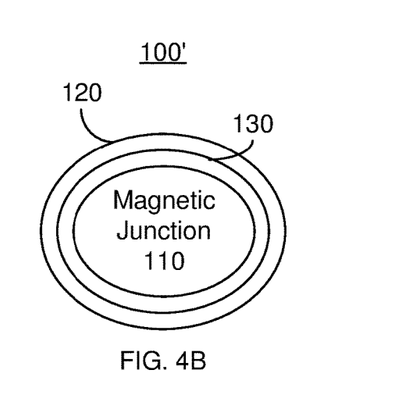

FIGS. 4A and 4B are side and plan views of an exemplary embodiment of a magnetic cell 100' usable in a magnetic devices such as a magnetic memory programmable using spin transfer torque. For clarity, FIGS. 4A-4B are not to scale. Further, other components that might be considered part of the cell 100', such as a selection transistor, are not shown for simplicity. The magnetic cell 100' may be used in a magnetic device such as a STT-MRAM and, therefore, in a variety of electronic devices. The magnetic cell 100' is analogous to the magnetic cell 100. Thus, analogous components have similar labels. The magnetic cell 100' includes a magnetic junction 110/110' that is switchable using spin transfer torque and an OTS layer 120 that are analogous to the magnetic junction 110/110' and OTS layer 120 of FIGS. 1A-2. Also shown are contacts 106 and 108, optional seed layer(s) 102 and optional capping layer(s) 104 that are analogous to the contacts 106 and 108, optional seed layer(s) 102 and optional capping layer(s) 104 shown in FIG. 1A. Thus, the structure, function and materials of these components 102, 104, 106, 108, 110/110' and 120 are similar in both the magnetic cell 100 and the magnetic cell 100'.

The magnetic cell 100' also include an encapsulation layer 130. For example, the encapsulation layer 130 may be an insulating layer. For example, an SiN layer, an SiO layer, or an SiN/SiO bilayer may be used for the encapsulation layer 130. This allows for shunting between the contacts 106 and 108 by the OTS layer 120 without potential for shorting of the magnetic junction 110/110' or interaction between the material(s) in the OTS layer 120 and those in the magnetic junction 110/110'. In addition, fabrication of the magnetic junction 110/110' may be unchanged through deposition of the encapsulation layer 130. Thus, the magnetic junction 100' may be simpler to fabricate.

The magnetic cell 100' may share the benefits of the magnetic cell 100. The OTS layer 120 may ensure that the write pulse has a high initial voltage and a lower subsequent voltage. Thus, faster and more reliable switching may be achieved. In addition, ESD and/or similar voltage-induced damage may be reduced or eliminated. Thus, reliability of the magnetic cell 100' may be improved.

Figure 5:
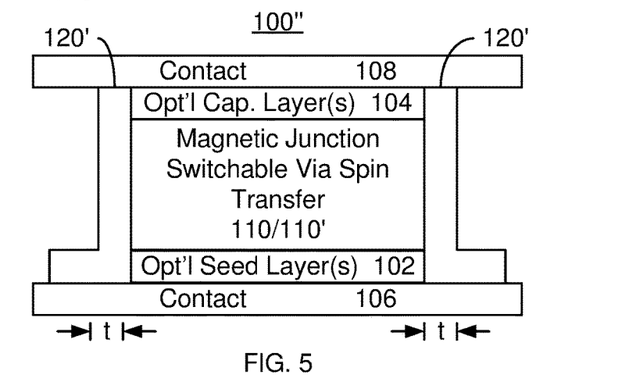
FIG. 5 is a side view of an exemplary embodiment of a magnetic cell usable in a magnetic devices such as a magnetic memory programmable using spin transfer torque.

FIG. 5 is a side view of an exemplary embodiment of a magnetic cell 100" usable in a magnetic devices such as a magnetic memory programmable using spin transfer torque. For clarity, FIG. 5 is not to scale. Further, other components that might be considered part of the cell 100", such as a selection transistor, are not shown for simplicity. The magnetic cell 100" may be used in a magnetic device such as a STT-MRAM and, therefore, in a variety of electronic devices. The magnetic cell 100" is analogous to the magnetic cell(s) 100 and/or 100'. Thus, analogous components have similar labels. The magnetic cell 100" includes a magnetic junction 110/110' that is switchable using spin transfer torque and an OTS layer 120' that are analogous to the magnetic junction 110/110' and OTS layer 120 of FIGS. 1A-4B. Also shown are contacts 106 and 108, optional seed layer(s) 102 and optional capping layer(s) 104 that are analogous to the contacts 106 and 108, optional seed layer(s) 102 and optional capping layer(s) 104 shown in FIG. 1A. Thus, the structure, function and materials of these components 102, 104, 106, 108, 110/110' and 120/120' are similar in both the magnetic cell 100 and the magnetic cell 100".

The OTS layer 120' is shown as extending slightly along the contact 106. In some embodiments, the OTS layer 120' may extend along the contact 108. Thus, the OTS layer 120' is not limited to the geometry shown in FIGS. 1A-1B and 4A-4B. In some embodiments, an encapsulation layer analogous to the encapsulation layer 130 may reside between the OTS layer 120' and the magnetic junction 110/110'.

The magnetic cell 100" may share the benefits of the magnetic cell(s) 100 and/or 100'. The OTS layer 120' may ensure that the write pulse has a high initial voltage and a lower subsequent voltage. Thus, faster and more reliable switching may be achieved. In addition, ESD and/or similar damage may be reduced or eliminated. Thus, reliability of the magnetic cell 100" may be improved.

Figure 6:
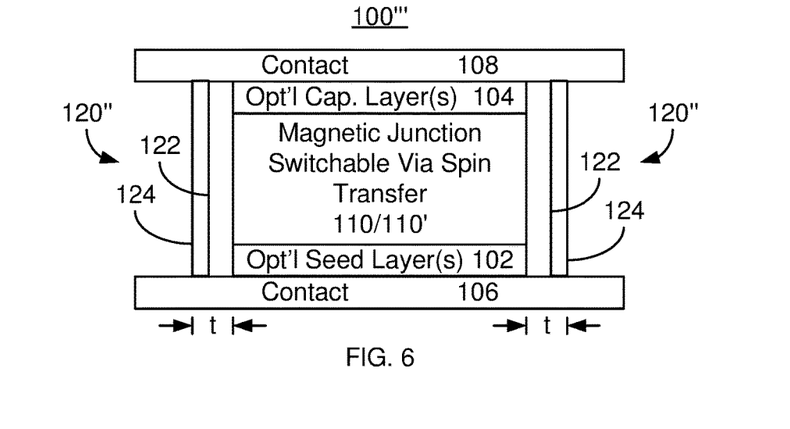
FIG. 6 is a side view of an exemplary embodiment of a magnetic cell usable in a magnetic devices such as a magnetic memory programmable using spin transfer torque.

FIG. 6 is a side view of an exemplary embodiment of a magnetic cell 100''' usable in a magnetic devices such as a magnetic memory programmable using spin transfer torque. For clarity, FIG. 6 is not to scale. Further, other components that might be considered part of the cell 100", such as a selection transistor, are not shown for simplicity. The magnetic cell 100" may be used in a magnetic device such as a STT-MRAM and, therefore, in a variety of electronic devices. The magnetic cell 100''' is analogous to the magnetic cell(s) 100, 100' and/or 100". Thus, analogous components have similar labels. The magnetic cell 100''' includes a magnetic junction 110/110' that is switchable using spin transfer torque and an OTS layer 120" that are analogous to the magnetic junction 110/110' and OTS layer 120/120' of FIGS. 1A-4B. Also shown are contacts 106 and 108, optional seed layer(s) 102 and optional capping layer(s) 104 that are analogous to the contacts 106 and 108, optional seed layer(s) 102 and optional capping layer(s) 104 shown in FIG. 1A. Thus, the structure, function and materials of these components 102, 104, 106, 108, 110/110' and 120/120'/120" are similar in both the magnetic cell 100 and the magnetic cell 100'''.

The OTS layer 120" shown in FIG. 6 is a multilayer. Thus, the OTS layer 120" includes layers 122 and 124. In some embodiments, both layers 122 and 124 are OTS layers. In other embodiments, the layers 122 and 124 cooperate to provide the functions of the OTS layer 120". Although two layers are shown, in other embodiments, another number of layers might be used. In some embodiments, an encapsulation layer analogous to the encapsulation layer 130 may reside between the OTS layer 120" and the magnetic junction 110/110'.

The magnetic cell 100''' may share the benefits of the magnetic cell(s) 100, 100' and/or 100". The OTS layer 120" may ensure that the write pulse has a high initial voltage and a lower subsequent voltage. Thus, faster and more reliable switching may be achieved. In addition, ESD and/or similar damage may be reduced or eliminated. Thus, reliability of the magnetic cell 100''' may be improved.

Various magnetic cells 100, 100', 100" and 100''' having various features have been described. One of ordinary skill in the art will recognize that various features may be combined in a manner not inconsistent with the method and system described herein.

Figure 7:
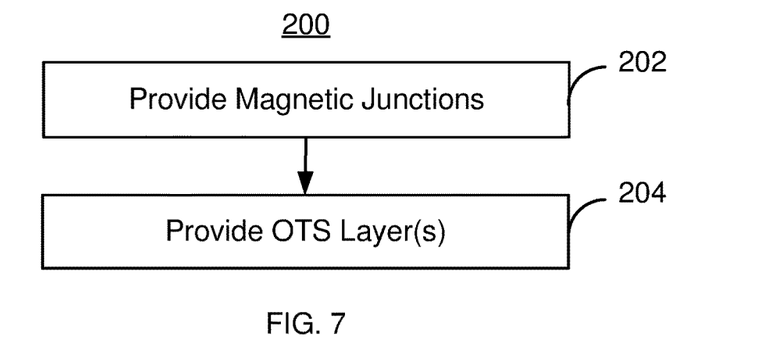
FIG. 7 is a flow chart depicting an exemplary embodiment of a method for providing a magnetic cell usable in a magnetic devices such as a magnetic memory programmable using spin transfer torque.

FIG. 7 is a flow chart depicting an exemplary embodiment of a method 200 for providing a magnetic cell usable in a magnetic device and including an OTS layer. For simplicity, some steps may be omitted, performed in another order, include substeps and/or combined. Further, the method 200 start after other steps in forming a magnetic memory have been performed. The method 200 is described in the context of the magnetic cell 100. However the method 200 may be used in forming other magnetic cell(s). Further, multiple magnetic cells may be simultaneously fabricated.

The magnetic junction 110/110' is provided, via step 202. Step 202 includes depositing the layers for the magnetic junction 110/110' and defining the edges of the magnetic junction 110/110'. Thus, the sidewalls on which the OTS layer 120 is formed are fabricated.

The OTS layer 120 is formed, via step 204. Step 204 includes depositing the OTS layer 120 such that a continuous film is formed on at least a portion of the magnetic junction sidewalls. The OTS layer 120 extends across at least the nonmagnetic spacer layers 112 and 117 (i.e. across any tunneling barrier layers). The OTS layer 120 may also extend from one contact 106 to the other contact 108.

Fabrication of the magnetic cell 100 and the device in which the magnetic cell 100 reside may then be completed. Additional structures, such as contacts and conductive lines may also be formed. Additional processing is accomplished without chemical processes being performed on much or all of the OTS layer 120. For example, the portion of the OTS layer 120 substantially parallel to the sides of the magnetic junction 110/110' may not be exposed to subsequent etches or other analogous processes. Instead, a refill layer may be deposited after step 204.

Using the method 200, the magnetic cell 100, 100', 100" and/or 100''' may be fabricated. Thus, a magnetic junction with improved performance and reliability may be achieved.

Figure 8:
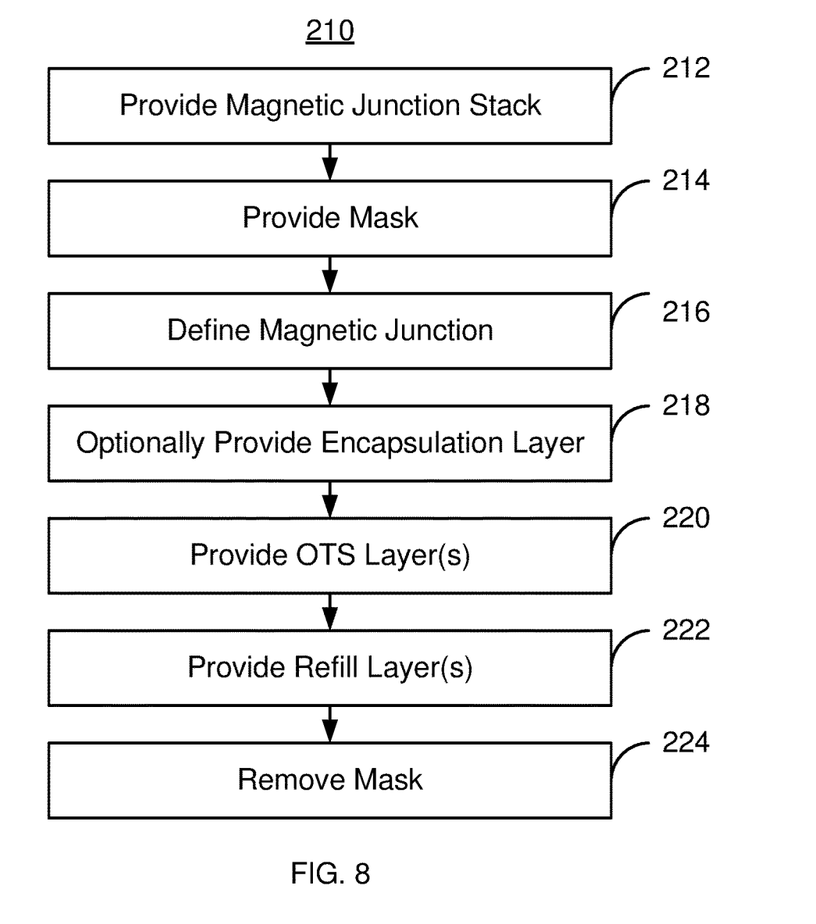
FIG. 8 is a flow chart depicting another exemplary embodiment of a method for providing a magnetic cell usable in a magnetic devices such as a magnetic memory programmable using spin transfer torque.

FIG. 8 is a flow chart depicting an exemplary embodiment of a method 210 for providing a magnetic cell usable in a magnetic device and including an OTS layer. For simplicity, some steps may be omitted, performed in another order, include substeps and/or combined. FIGS. 9-12 depict an exemplary embodiment of a magnetic device 300 during fabrication using the method 210. FIGS. 9-12 are not to scale. For simplicity, only certain portions of the magnetic device 300 are shown and described. The method 210 is described in the context of the magnetic device 300. However the method 210 may be used in forming other magnetic device(s). The method 210 starts after other steps in forming the magnetic device have been performed. Further, multiple magnetic cells may be simultaneously fabricated.

A magnetic junction stack is provided, via step 212. Step 212 includes depositing the layer(s) for the magnetic junction(s) being formed. Thus, one or more pinned layers, nonmagnetic spacer/tunneling barrier layers and one or more free layers are deposited. Additional layers, such as seed layers and/or capping layers, may also be provided.

Figure 9:
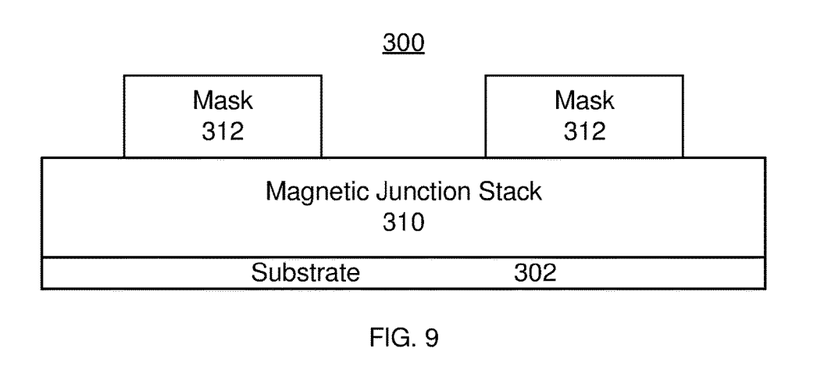
FIGS. 9-12 depict an exemplary embodiment of a magnetic memory usable in a magnetic devices such as a magnetic memory programmable using spin transfer torque during fabrication.

A mask is provided on the magnetic junction stack, via step 214. The mask covers the region(s) of the magnetic junction stack that will form the magnetic junctions. Step 214 may include forming a photoresist mask, a hard mask and/or another type of mask. FIG. 9 depicts the magnetic device 300 after step 214 is performed. Thus, the magnetic junction stack 310 and mask 312 are shown on a substrate 302. The substrate 302 may include contacts and, in some embodiments, other structures such as selection transistor(s) (not shown in FIGS. 9-12).

Figure 10:
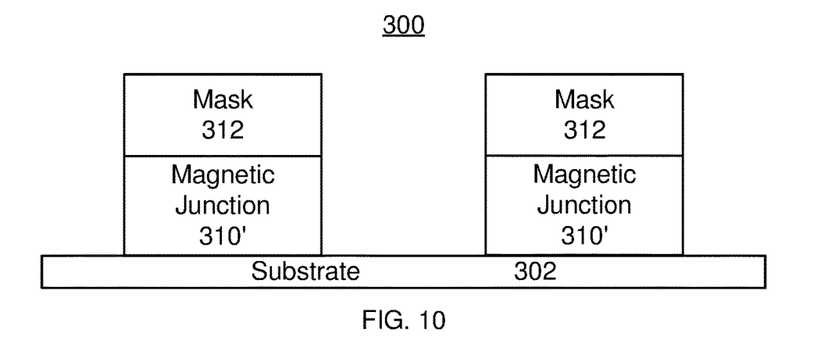

The exposed portions of the magnetic junction stack are removed, via step 216. Thus, the sidewalls of the magnetic junctions are defined in step 216. Step 216 may include performing an ion mill, a reactive ion etch and/or other processes. FIG. 10 depicts the magnetic device 300 after step 216 has been performed. Thus, magnetic junctions 310' have been defined.

An encapsulation layer is optionally provided, via step 218. Step 218 may include depositing an SiN/SiO bilayer or other insulating encapsulation layer. In other embodiments, step 218 may be omitted.

Figure 11:
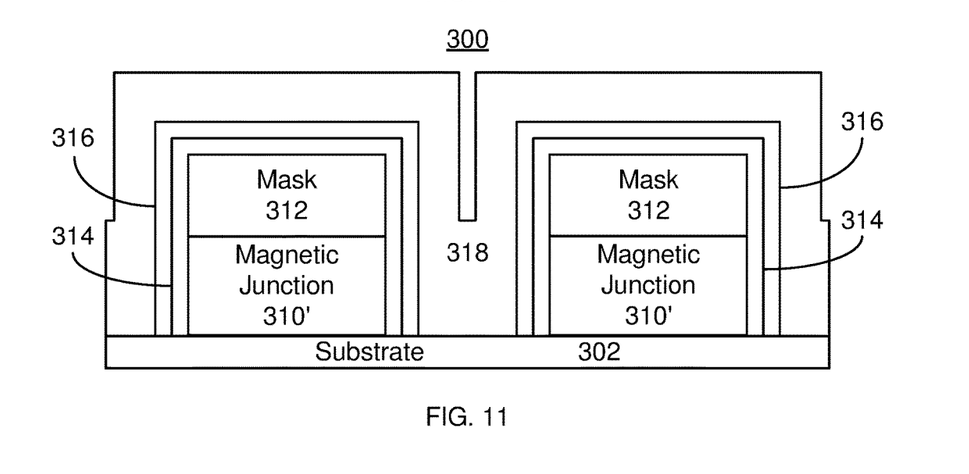

OTS layer(s) are provided, via step 220. Step 220 may include performing atomic layer deposition of the OTS materials. Other fabrication processes might be used in other embodiments. An insulating refill layer may also be provided, via step 222. Step 222 may include depositing an aluminum oxide or other insulating layer. FIG. 11 depicts the magnetic device 300 after step 222 is performed. Thus, optional encapsulation layer 314 and OTS layer(s) 316 are shown. Also depicted is refill layer 318.

Figure 12:
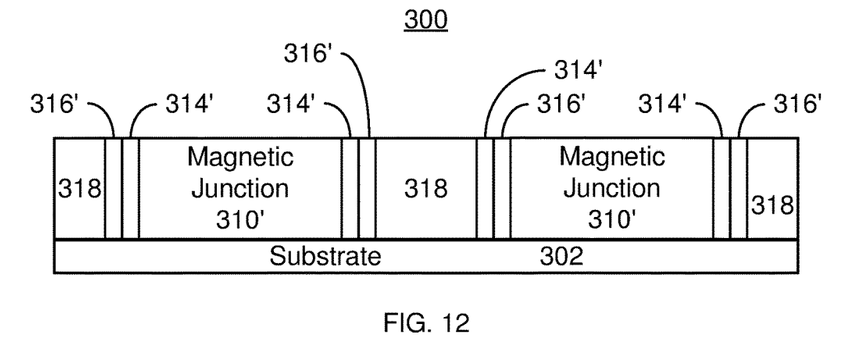

The mask 312 is removed, via step 224. Step 224 may include performing a liftoff process. FIG. 12 depicts the magnetic device 300 after step 224 is performed. Thus, encapsulation layers 314' and OTS layers 316' remain on magnetic junctions 130'. Fabrication of the magnetic junction may then be completed.

Using the method 210, the magnetic device 300 includes magnetic junctions 310' and OTS layers 316' may be fabricated. Thus, a magnetic junction having improved performance and reliability may be achieved.

Figure 13:
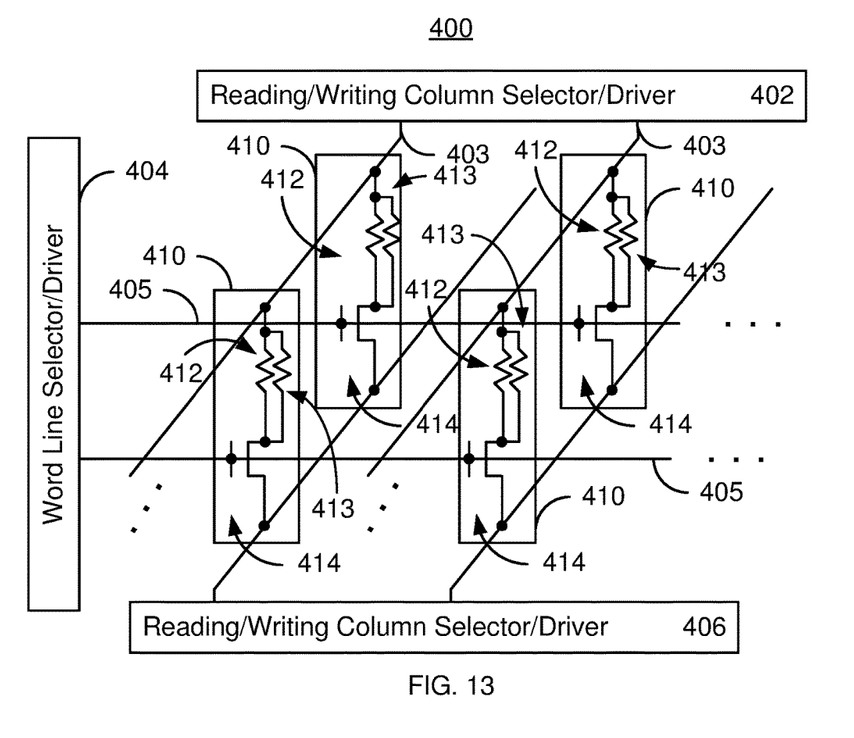
FIG. 13 depicts an exemplary embodiment of a memory utilizing magnetic junctions in the memory element(s) of the storage cell(s).

FIG. 13 depicts an exemplary embodiment of a memory 400 that may use one or more of the magnetic cells 100, 100', 100", 100''' and/or other magnetic cells including a structure analogous to the OTS layer 120/120'/120". The magnetic memory 400 includes reading/writing column select drivers 402 and 406 as well as word line select driver 404. Note that other and/or different components may be provided. The storage region of the memory 400 includes magnetic storage cells 410 analogous to the magnetic cell(s) 100, 100', 100" and/or 100'''. Each magnetic storage cell includes at least one magnetic junction 412, an OTS layer 413 and at least one selection device 414. In some embodiments, the selection device 414 is a transistor. Although one magnetic junction 412 is shown per cell 410, in other embodiments, another number of magnetic junctions 412 may be provided per cell. As such, the magnetic memory 400 may enjoy the benefits described above.

A method and system for providing a magnetic junction and a memory fabricated using the magnetic junction has been described. Although the method and apparatus have been described in the context of specific features, steps and components, one of ordinary skill in the art will recognize that one or more of these features, steps and/or components may be combined in other manners not inconsistent with the description herein. The method and system have also been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

I claim:

1. A magnetic cell residing on a substrate and usable in a magnetic device comprising:
   a magnetic junction having a plurality of sidewalls, the magnetic junction including a free layer switchable between a plurality of stable magnetic states when a write current is passed through the magnetic junction, a nonmagnetic spacer layer and a pinned layer, the nonmagnetic spacer layer residing between the pinned layer and the free layer, the plurality of sidewalls including a portion of the pinned layer, a portion of the nonmagnetic spacer layer and a portion of the free layer; and
   an ovonic threshold switch (OTS) layer covering at least a portion of the plurality of sidewalls such that the OTS layer covers part of the pinned layer, part of the free layer and part of the nonmagnetic spacer layer, the OTS layer having a threshold voltage of at least 0.5 V and not more than 5 volts such that the OTS layer switches from an insulating state below the threshold voltage to a conductive state above the threshold voltage.

2. The magnetic cell of claim 1 wherein the OTS layer includes at least one of GeSbTe (GST), GeTe$_6$ and AnInSbTe.

3. The magnetic cell of claim 1 wherein the OTS layer is continuous and has a thickness of not more than two nanometers.

4. The magnetic cell of claim 1 wherein the OTS layer has a thickness of at least two nanometers and not more than ten nanometers.

5. The magnetic cell of claim 1 wherein the OTS layer shares an interface with the at least the portion of the plurality of sidewalls.

6. A magnetic cell residing on a substrate and usable in a magnetic device comprising:
   a magnetic junction having a plurality of sidewalls, the magnetic junction including a free layer switchable between a plurality of stable magnetic states when a write current is passed through the magnetic junction, a nonmagnetic spacer layer and a pinned layer, the nonmagnetic spacer layer residing between the pinned layer and the free layer;
   an ovonic threshold switch (OTS) layer covering at least a portion of the plurality of sidewalls, the OTS layer having a threshold voltage of at least 0.5 V and not more than 5 volts such that the OTS layer switches from an insulating state below the threshold voltage to a conductive state above the threshold voltage; and
   an encapsulation layer between the at least the portion of the plurality of sidewalls and the OTS layer, the encapsulation layer being insulating.

7. A magnetic cell residing on a substrate and usable in a magnetic device comprising:
   a magnetic junction having a plurality of sidewalls, the magnetic junction including a free layer switchable between a plurality of stable magnetic states when a write current is passed through the magnetic junction, a nonmagnetic spacer layer and a pinned layer, the nonmagnetic spacer layer residing between the pinned layer and the free layer;
   an ovonic threshold switch (OTS) layer covering at least a portion of the plurality of sidewalls, the OTS layer having a threshold voltage of at least 0.5 V and not more than 5 volts such that the OTS layer switches from an insulating state below the threshold voltage to a conductive state above the threshold voltage; and
   wherein the OTS layer covers the plurality of sidewalls.

8. The magnetic cell of claim 1 wherein the threshold voltage is at least 1 volt and not more than 5 volts.

9. The magnetic cell of claim 1 wherein the pinned layer has a pinned layer perpendicular magnetic anisotropy energy greater than a pinned layer out-of-plane demagnetization energy, wherein the free layer has a free layer perpendicular magnetic anisotropy energy greater than a free layer out-of-plane demagnetization energy and wherein the nonmagnetic spacer layer is a tunneling barrier layer.

10. The magnetic cell of claim 1 wherein the magnetic junction includes an additional pinned layer and an additional nonmagnetic spacer layer between the additional pinned layer and the free layer.

11. A magnetic memory residing on a substrate and comprising:
    a plurality of magnetic storage cells, each of the plurality of magnetic storage cells including at least one magnetic junction and an ovonic threshold switch (OTS) layer, each of the at least one magnetic junction having a plurality of sidewalls and including a free layer switchable between a plurality of stable magnetic states when a write current is passed through the magnetic junction, a nonmagnetic spacer layer and a pinned layer, the nonmagnetic spacer layer residing between the pinned layer and the free layer, the plurality of sidewalls including a portion of the pinned layer, a portion of the nonmagnetic spacer layer and a portion of the free layer, the OTS layer covering at least a portion of the plurality of sidewalls such that the OTS layer covers part of the pinned layer, part of the free layer and part of the nonmagnetic spacer layer, the OTS layer having a threshold voltage of at least 0.5 V and not more than 5 volts such that the OTS layer switches from an insulating state below the threshold voltage to a conductive state above the threshold voltage; and
    a plurality of bit lines coupled with the plurality of magnetic storage cells.

12. A method of providing magnetic cell residing on a substrate and usable in a magnetic device, the method comprising:
    providing a magnetic junction having a plurality of sidewalls, the magnetic junction including a free layer switchable between a plurality of stable magnetic states when a write current is passed through the magnetic junction, a nonmagnetic spacer layer and a pinned layer, the nonmagnetic spacer layer residing between the pinned layer and the free layer, the plurality of sidewalls including a portion of the pinned layer, a portion of the nonmagnetic spacer layer and a portion of the free layer; and providing an ovonic threshold switch (OTS) layer covering at least a portion of the plurality of sidewalls such that the OTS layer covers part of the pinned layer, part of the free layer and part of the nonmagnetic spacer layer, the OTS layer having a threshold voltage of at least 0.5 V and not more than 5 volts such that the OTS layer switches from an insulating state below the threshold voltage to a conductive state above the threshold voltage.

13. The method of claim 12 wherein the step of providing the OTS layer includes:

depositing a layer including at least one of GeSbTe (GST) and AnInSbTe.

14. A method of providing magnetic cell residing on a substrate and usable in a magnetic device, the method comprising:

providing a magnetic junction having a plurality of sidewalls, the magnetic junction including a free layer switchable between a plurality of stable magnetic states when a write current is passed through the magnetic junction, a nonmagnetic spacer layer and a pinned layer, the nonmagnetic spacer layer residing between the pinned layer and the free layer; and providing an ovonic threshold switch (OTS) layer covering at least a portion of the plurality of sidewalls; wherein the step of providing the magnetic junction further includes:

providing a magnetic junction stack;

providing a mask on the magnetic junction stack, the mask covering a portion of the magnetic junction stack corresponding to the magnetic junction;

removing an exposed portion of the magnetic junction stack; and wherein the step of providing the OTS layer further includes depositing the at least one layer corresponding to the OTS layer before removal of the mask.

15. The method of claim 14 further comprising:

depositing a refill layer covering the at least one layer; and removing the mask after the step of depositing the refill layer.

16. The method of claim 12 wherein the OTS layer is continuous and has a thickness of not more than ten nanometers.

17. The method of claim 12 wherein the OTS layer shares an interface with the at least the portion of the plurality of sidewalls.

18. A method of providing magnetic cell residing on a substrate and usable in a magnetic device, the method comprising:

providing a magnetic junction having a plurality of sidewalls, the magnetic junction including a free layer switchable between a plurality of stable magnetic states when a write current is passed through the magnetic junction, a nonmagnetic spacer layer and a pinned layer, the nonmagnetic spacer layer residing between the pinned layer and the free layer;

providing an encapsulation layer between the at least the portion of the plurality of sidewalls and the OTS layer, the encapsulation layer being insulating; and providing an ovonic threshold switch (OTS) layer covering at least a portion of the plurality of sidewalls, the OTS layer having a threshold voltage of at least 0.5 V and not more than 5 volts such that the OTS layer switches from an insulating state below the threshold voltage to a conductive state above the threshold voltage.

* * * * *